US007254239B2

(12) United States Patent
Fincham

(10) Patent No.: US 7,254,239 B2
(45) Date of Patent: Aug. 7, 2007

(54) SOUND SYSTEM AND METHOD OF SOUND REPRODUCTION

(75) Inventor: Lawrence R. Fincham, Santa Rosa, CA (US)

(73) Assignee: THX Ltd., San Rafael, CA (US)

( * ) Notice: Subject to any disclaimer, the term of this patent is extended or adjusted under 35 U.S.C. 154(b) by 449 days.

(21) Appl. No.: 10/074,604

(22) Filed: Feb. 11, 2002

(65) Prior Publication Data

US 2002/0154783 A1 Oct. 24, 2002

Related U.S. Application Data

(60) Provisional application No. 60/267,952, filed on Feb. 9, 2001.

(51) Int. Cl.
*H04R 5/00* (2006.01)
*H03G 1/00* (2006.01)

(52) U.S. Cl. ............................ 381/17; 381/1; 381/307; 381/97

(58) Field of Classification Search .................. 381/17, 381/18, 300, 304, 307, 1, 87, 89, 309, 103
See application file for complete search history.

(56) References Cited

U.S. PATENT DOCUMENTS 3,617,654 A 11/1971 Heidrich ..................... 381/346
4,308,423 A * 12/1981 Cohen ........................... 381/1
4,509,184 A 4/1985 Yanagawa ................... 381/308
5,043,970 A * 8/1991 Holman ....................... 369/89
5,199,075 A * 3/1993 Fosgate ...................... 381/307
5,253,301 A 10/1993 Sakamoto et al. ............ 381/89
5,561,717 A 10/1996 Lamm ......................... 381/89
5,657,391 A * 8/1997 Jyosako ......................... 381/1

(Continued)

FOREIGN PATENT DOCUMENTS

EP 0404 117 A2 12/1990

(Continued)

OTHER PUBLICATIONS

Lopez, Jose, et al., "3-D Audio With Dynamic Tracking For Multimedia Environtments," Universidad Politecnica de Valencia, Departamento de Comunicaciones, Grao de Gandia, Spain.

(Continued)

*Primary Examiner*—Xu Mei
(74) *Attorney, Agent, or Firm*—Irell & Manella LLP

(57) ABSTRACT

A sound reproduction system comprises a left and right speakers located in close proximity, and a sound processor which provides audio signals to the pair of speakers. The sound processor preferably derives a cancellation signal from the difference between the left and right channels. The resulting difference signal is scaled, delayed (if necessary), and spectrally modified before being added to the left channel and, in opposite polarity, to the right channel. The spectral modification to the difference channel preferably takes the form of a low-frequency boost over a specified frequency range, in order to restore the correct timbral balance after the differencing process. Additional phase-compensating all-pass networks may be inserted in the difference channel to correct for any extra phase shift contributed by the spectral modifying circuit. The technique may be used in a surround sound system.

48 Claims, 11 Drawing Sheets

U.S. PATENT DOCUMENTS

| | | | | |
|---|---|---|---|---|
| 5,661,808 | A * | 8/1997 | Klayman | 381/1 |
| 5,677,957 | A * | 10/1997 | Hulsebus | 381/1 |
| 5,727,066 | A | 3/1998 | Elliott et al. | 381/1 |
| 5,862,227 | A | 1/1999 | Orduna-Bustamante et al. | 381/17 |
| 5,870,484 | A | 2/1999 | Greenberger | 381/300 |
| 5,949,894 | A | 9/1999 | Nelson et al. | 381/300 |
| 6,198,826 | B1 * | 3/2001 | Cowieson et al. | 381/18 |
| 6,363,157 | B1 | 3/2002 | Chick | 381/89 |
| 2002/0085731 | A1 | 7/2002 | Aylward | 381/349 |
| 2003/0219137 | A1 | 11/2003 | Fincham | 381/302 |
| 2005/0129258 | A1 | 6/2005 | Fincham | 381/160 |

FOREIGN PATENT DOCUMENTS

| | | |
|---|---|---|
| GB | 2 074 823 A | 11/1981 |
| JP | 56-016400 | 2/1981 |
| JP | 56-162600 | 12/1981 |
| JP | 63-502945 | 10/1988 |
| JP | 11-318000 | 11/1999 |
| WO | WO 87/06090 | 10/1987 |
| WO | WO 94/01981 | 1/1994 |

OTHER PUBLICATIONS

Brown, C. Phillip, et al., "A Structural Model for Binaural Sound Synthesis," IEEE Transactions on Speech and Audio Processing, vol. 6, No. 5, Sep. 1998.

Jost, Adrian, et al., "Transaural 3-D With User-Controlled Calibration," Proceedings of the COST G-6 Conference on Digital Audio Effects (DAFX-00), Verona, Italy, Dec. 7-9, 2000.

Jot, Jean-Marc, "Synthesizing Three-Dimensional Sound Scenes in Audio or Multimedia Production and Interactive Human-Computer Interfaces," 5th International Conference: Interface to Real & Virtual Worlds, Montpellier, France, May 1996.

Kyriakakis, Chris, "Fundamental and Technological Limitations of Immersive Audio Systems," Proceedings of the IEEE, vol. 86, No. 5, May 1998.

Kendall, Gary S., "A 3D Sound Primer," Center for Music Technology, School of Music, Northwestern University, printout from website (www.northwestern.edu/musicschool/classes/3D/pages/sndPrmGK.html), printed Jan. 4, 2002.

Soebo, Asbjorn, "Effect of Early Reflections in Binaural Systems With Loudspeaker Reproduction," Acoustics Group, Department of Telecommunications, Norwegian University of Science and Technology (NTNU), Proc. 1999 IEEE Workshop on Applications of Signal Processing to Audio and Acoustics, New Paltz, New York, Oct. 17-20, 1999.

Zurek, P.M., "The Precedence Effect," *Directional Hearing*, Springer-Verlag, New York, 1987, pp. 85-105.

Trahiotis, Bernstein, "Some Modern Techniques and Devices Used to Preserve and Enhance the Spatial Qualities of Sound," *Directional Hearing*, Springer-Verlag, New York, 1987, pp. 279-290.

"Virtual Acoustics Project," Institute of Sound and Vibration Research, University of Southampton, printout from website (www.isvr.soton.ac.uk/FDAG/vap/), Feb. 4, 1998.

Kahana, et al, "Multi-Channel Sound Reproduction using a Four-Ear Dummy-Head," presented at the 102nd Audio Engineering Society Convention, Mar. 22-25, 1997, Munich, Germany.

Kahana, et al, "Objective and Subjective Assessment of Systems for the Production of Virtual Acoustic Images for Multiple Listeners," presented at the 102nd Audio Engineering Society Convention, Mar. 22-25, 1997, Munich, Germany.

Kahana, et al, "A Multiple Microphone Recording Technique for the Generation of Virtual Acoustic Images," Journal of the Acoustical Society of America, vol. 105, No. 3, Mar. 1999, pp. 1503-1516.

Kirkeby, et al, "Local Sound Field Reproduction using Digital Signal Processing," Journal of the Acoustical Society of America, vol. 100, No. 3, Sep. 1996, pp. 1584-1593.

Kirkeby, et al, "Virtual Source Imaging Over Loudspeakers," Proceedings of the Institute of Acoustics, vol. 19: Part 6, 1997.

Kirkeby, et al, "The 'Stereo Dipole': Binaural Sound Reproduction using Two Closely Spaced Loudspeakers," presented at the 102nd Audio Engineering Society Convention, Mar. 22-25, 1997, Munich, Germany.

Kirkeby, et al, "Acoustic Fields Generated by Virtual Source Imaging Systems," Proceedings of Active 97, The 1997 International Symposium on Active Control of Sound and Vibration, Aug. 21-23, 1997, Budapest, Hungary, pp. 941-954.

Nelson, et al, "Adaptive Inverse Filters for Stereophonic Sound Reproduction," IEEE Transactions on Signal Processing, vol. 40, No. 7, Jul. 1992, pp. 1621-1632.

Nelson, P. A., "Active Control of Acoustic Fields and the Reproduction of Sound," Journal of Sound and Vibration, vol. 177, No. 4, Nov. 3, 1994, pp. 447-477.

Nelson, et al, "Inverse Filter Design and Equalization Zones in Multichannel Sound Reproduction," IEEE Transactions on Speech and Audio Processing, vol. 3, No. 3, May 1995, pp. 185-192.

Nelson, et al, "Multichannel Signal Processing Techniques in the Reproduction of Sound," Journal of the Audio Engineering Society, vol. 44, No. 11, Nov. 1996, pp. 973-989.

Nelson, et al, "Experiments on a System for the Synthesis of Virtual Acoustic Sources," Journal of the Audio Engineering Society, vol. 44, No. 11, Nov. 1996, pp. 990-1007.

Nelson, et al, "Sound Fields for the Production of Virtual Acoustic Images," Journal of Sound and Vibration, vol. 204, No. 2, 1997, pp. 386-396.

Takeuchi, et al, "The Effects of Reflections on the Performance of Virtual Acoustic Imaging Systems," Proceedings of Active 97, The 1997 International Symposium on Active Control of Sound and Vibration, Aug. 21-23, 1997, Budapest, Hungary, pp. 927-940.

U.S. Appl. No. 11/416,626, filed May 2006, Fincham.

* cited by examiner

SOUND SYSTEM AND METHOD OF SOUND REPRODUCTION

RELATED APPLICATION INFORMATION

This application claims priority to U.S. Provisional Application Ser. No. 60/267,952 filed Feb. 9, 2001, hereby incorporated by reference as if set forth fully herein.

BACKGROUND OF THE INVENTION

1) Field of the Invention

The field of the present invention relates to sound reproduction and, more specifically, to a speaker configuration and related sound processing for use in a sound system.

2) Background

Attaining optimal sound quality in surround sound or multi-channel sound systems, over the largest possible listening area, can be quite challenging. Some of the difficulties in achieving optimal sound quality in such systems result from the fact that a wide variety of different surround sound and multi-channel audio formats and speaker configurations exist, so that a particular sound system may have reasonably acceptable sound with respect to one or perhaps two audio formats yet sub-optimal sound with respect to other audio formats. Therefore, where a consumer desires, for example, to use a single sound system to play sound recordings in a variety of different formats, different levels of sound quality, some of which are poor or impaired, are likely to be experienced. While the user can adjust speaker positioning or relative balances to try to improve sound quality, such techniques may involve significant manual effort or inconvenience, may be hard to reproduce consistently, and may benefit only one or perhaps a few listeners in a relatively small portion of the listening area.

Existing surround sound recording formats include those referred to as 5.1, 6.1 and 7.1. The 5.1 surround format comprises a compressed data stream containing five channels, generally designated left, center, right, surround left, and surround right, named for the speaker positions for which the channel information is intended. A low frequency effects channel is formed by a combination of the five other channels, and may be provided to a sub-woofer. The 6.1 surround format includes the same five channels as the 5.1 surround format, but adds a surround back channel, which may be fed to one or more back speakers in a surround sound system. The 7.1 surround format is similar to the 6.1 surround format, but has two surround back channels (surround back left and surround back right) rather than a single back channel, for a total of seven channels. Thus, the 5.1 surround format has two surround channels (surround left and right), the 6.1 surround format has three surround channels (surround left, right and back), and the 7.1 surround format has four surround channels (surround left and right, and surround back left and right).

Basic surround system speaker configurations generally include from six to eight speakers placed at conventionally well-established locations, according to the type of surround format they are intended to play. A six-speaker surround system typically includes left, right and center speakers (with the right and left speakers spaced widely apart), a sub-woofer, and surround left and right speakers (which may be monopolar or dipolar in nature). A seven-speaker surround system typically includes the same speaker arrangement as the six-speaker surround system, but adds a back surround speaker. An eight-speaker surround system typically includes the same speaker arrangement as the six-speaker surround system, but adds a back left surround speaker and a back right surround speaker.

The enjoyment experienced by a listener in a surround sound system can be affected by a number of factors, including the listener's physical position relative to the various speakers, as well as by the particular format of the audio track being played on the system. For example, when a 5.1 surround format soundtrack is played on an eight-speaker (7.1) surround system, certain anomalies may occur. An example is that, if the 5.1 surround left and surround right audio signals are monaural, then the left and right surround effects can disappear, being replaced by a single central "phantom" sound image at the rear. Another phenomenon is that if the listener is positioned in the middle of the surround left and surround right speakers, he or she may perceive the surround left and right sound (if monaural) to be higher in volume that it otherwise would be, primarily due to the additive effect of the sound waves intersecting at the listener's position (known as a "lift" effect). If the sound pans from one side to the other (e.g., from left to right), the sound volume may appear to increase as left/right balance is achieved, and then appear to decrease as the sound continues to pan, even though the audio output level remains constant, due to the same "lift" effect. The sound quality may also seem to be "unstable," in the sense that if the listener moves from the center position, the sound might seem to "flip" from one side to the other.

Some of these effects can be mitigated in 5.1 surround sound systems by the use of adaptive decorrelation with respect to the surround left and right speakers, which derives two substantially decorrelated signals when the surround left and right signals are monaural, in order to provide an improved enveloping surround effect.

When a 6.1 surround format soundtrack is played on an eight-speaker (7.1) surround system, certain other anomalies may be experienced. Since the two rear surround speakers (left and right) are each fed with an identical monaural signal (that is, the same surround back signal), a centrally located "phantom" image may result when the listener is positioned approximately equidistant from the speakers. Reported side effects of this arrangement include "coloration" associated with the phantom image (for example, the sound may seem "unnatural"), a narrow "sweet spot" due to lack of sound image stability when the listener moves off center, and a comb filter effect (in other words, nulls may be produced due to sound wave cancellation effects).

Besides surround systems, a variety of multi-channel recording and playback systems also exist. Examples of some common multi-channel sound systems are Dolby AC-3, DTS, and DVD-Audio, each of which has its own specific digital encoding format. Unlike cinema sound, there is generally no single adopted standard of either loudspeaker type (e.g., full range, satellite plus sub-woofer, dipole, monopole) or speaker layout for most multi-channel audio formats. Any user therefore desiring to listen to multi-channel soundtracks, and/or any of the surround formats (5.1., 6.1 and 7.1), is required either to accept one speaker layout optimized for a particular audio format and experience a compromised performance for all others, or to reconnect various speakers to suit the audio format a particular soundtrack.

Beyond the surround sound environment, other sound systems also face similar challenges, such as attaining a suitably wide "sweet spot" in which the perceived area and stability of a stereo sound image is maximized. In most traditional sound systems, the convention has been to place left and right speakers far apart physically, under the theory that the human ear is thereby better able to perceive the richness of the audio subject matter. However, under many left/right speaker configurations, the sound at off-axis listening positions may be sub-optimal. The quality of sound at a given off-axis listening position may be affected not only by the difference between left and right volumes resulting from the different distances to the left and right speakers, but also by the slight difference in time it takes the aural information to reach the listener.

Accordingly, it would be advantageous to provide an improved sound system which overcomes one or more of the foregoing problems or shortcomings.

SUMMARY OF THE INVENTION

The present invention is generally directed to improved sound reproduction systems and methods involving a speaker configuration and/or placement, and related sound processing, for enlarging the perceived area and stability of a sound image generated from right and left source signals.

In one aspect, a sound reproduction system comprises a pair of speakers (left and right) located in close proximity, and a sound processor which provides audio signals to the pair of speakers. According to a preferred embodiment, the sound processor acts to "spread" the sound image produced by the two closely spaced speakers by employing a cross-cancellation technique wherein a cancellation signal is derived, for example, from the difference between the left and right channels. The resulting difference signal is scaled, delayed (if necessary) and spectrally modified before being added to the left channel and, in opposite polarity, to the right channel. The spectral modification to the difference channel preferably takes the form of a low-frequency boost over a specified frequency range, in order to restore the correct timbral balance after the differencing process which causes a loss of bass when the low-frequency signals in each channel are similar. Additional phase-compensating all-pass networks may be inserted in the difference channel to correct for any extra phase shift contributed by the usually minimum-phase-shift spectral modifying circuit so that the correct phase relationship between the canceling signal and the direct signal is maintained over the desired frequency range.

Alternatively, a linear-phase network may be employed to provide the spectral modification to the difference channel, in which case compensation can be provided by application of an appropriate, and substantially identical, frequency-independent delay to both left and right channels.

The various speaker configuration and sound processing embodiments as described herein may be employed in connection with a surround sound system to achieve improved sound reproduction. A sound reproduction system for a surround sound stereophonic system may comprise a set of speakers (e.g., front, left, center, surround left, and surround right), including a pair of surround back speakers located in close proximity, and a sound processor. The sound processor receives left and right surround channel signals (either side or rear surround signals), and generates a difference signal therefrom. The resulting difference signal may be processed as described above—i.e., scaled, delayed (if necessary) and spectrally modified before being added to the left channel and, in opposite polarity, to the right channel. Additional phase-compensating all-pass networks may, as noted above, be inserted in the difference channel to correct for any extra phase shift contributed by the usually minimum-phase-shift spectral modifying circuit so that the correct phase relationship between the canceling signal and the direct signal is maintained over the desired frequency range.

Further embodiments, variations and enhancements are also disclosed herein.

BRIEF DESCRIPTION OF THE DRAWINGS

FIG. 9-1 is a more detailed diagram of a sound processing system as may be used, for example, in connection with the system illustrated in FIG. 6

FIG. 9-2 is a diagram of a sound processing system in general accordance with the layout illustrated in FIG. 9-1, further showing examples of possible transfer function characteristics for certain processing blocks.

FIGS. 15-1, 15-2, and 15-3 are graphs illustrating examples of gain and/or phase transfer functions for a sound processing system in accordance with FIG. 9-2.

DETAILED DESCRIPTION OF PREFERRED EMBODIMENTS

According to various embodiments as disclosed herein, a preferred sound reproduction system comprises, in one aspect, a pair of speakers located in close proximity, and a sound processor which provides audio signals to the pair of speakers. The sound processor preferably acts to "spread" the sound image produced by the two closely spaced speakers by employing a cross-cancellation technique wherein a cancellation signal is derived, for example, from the difference between the left and right channels. The resulting difference signal is scaled, delayed (if necessary) and spectrally modified before being added to the left channel and, in opposite polarity, to the right channel, thereby enlarging the perceived area and stability of the stereo sound image. Further details of preferred sound processing techniques are described later herein.

Figure 1:
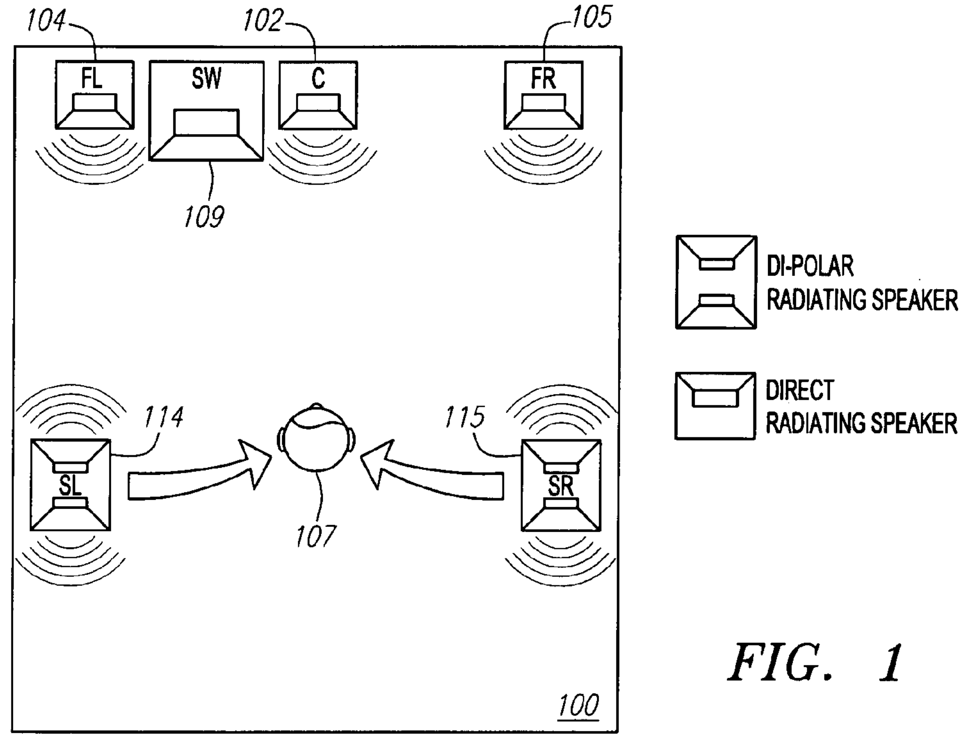
FIG. 1 is a diagram illustrating playback of a soundtrack in a 5.1 surround system.

Some advantages of various embodiments disclosed herein can be appreciated by way of contrast and comparison with conventional surround/multi-channel sound systems. FIG. 1, for example, is a diagram illustrating playback of a surround-encoded soundtrack in a 5.1 surround system 100. As shown in FIG. 1, the 5.1 surround system 100 includes a front left speaker 104, a front right speaker 105, a center speaker 102, a sub-woofer 109, a surround left speaker 114, and a surround right speaker 115. In the example shown in FIG. 1, the surround left and right speakers 114, 115 are both dipolar speakers, which distribute sound in multiple (typically opposite) directions and are thereby provide improved ambient sound. The surround left and right speakers 114, 115 are typically widely spaced on opposite sides of a room (or other listening space), at positions which are above and slightly to the rear of the desired listening position.

The speakers 102, 104, 105, 109, 114, and 115 in the 5.1 surround system 100 are generally arranged to provide optimum sound for a listener 107 positioned in the approximate center of the speaker arrangement. However, a 5.1 surround system lacks an effective directional component to the immediate left and right sides and to the rear of the listener 107. Therefore, a 6.1 or 7.1 surround system, both of which have a rear speaker component, is generally capable of providing superior sound and audio effects in certain contexts. A 6.1 surround system, as previously indicated, adds a single rear surround speaker, while a 7.1 surround system adds two rear surround speakers typically spaced relatively far apart from one another.

Figure 2:
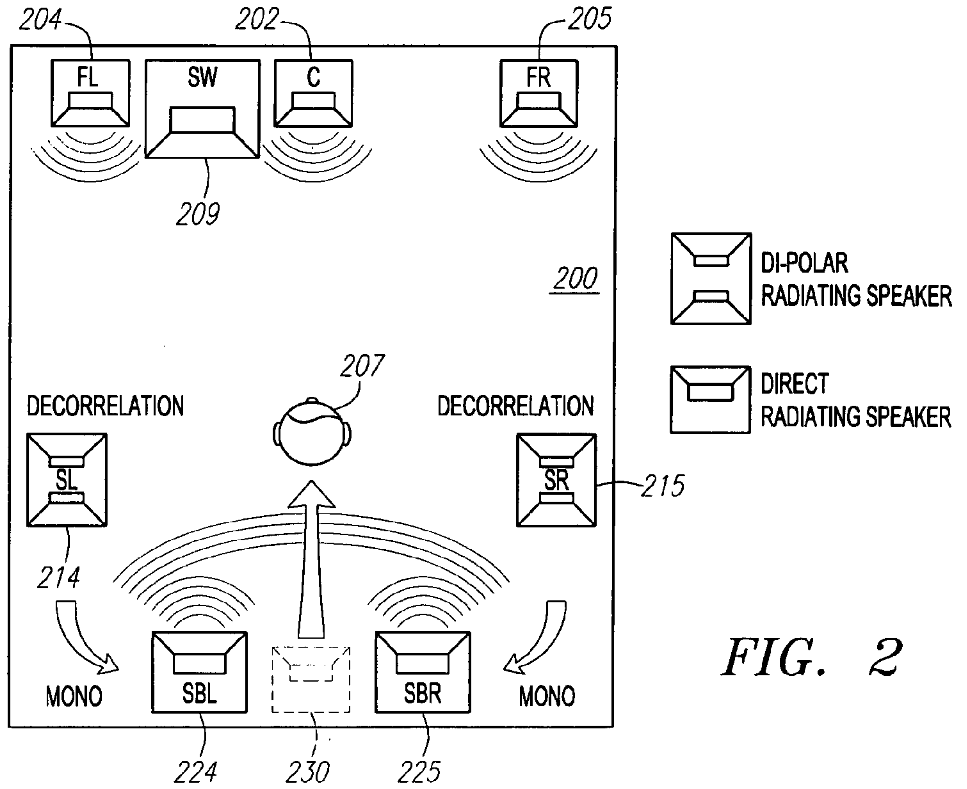
FIG. 2 is a diagram illustrating playback of a 5.1 surround format soundtrack in a 7.1 surround sound system.

FIG. 2 is a diagram of a 7.1 surround system 200, illustrating playback of a 5.1 surround-encoded soundtrack. As shown in FIG. 2, the 7.1 surround system 200 includes front left and right speakers 204, 205, a center speaker 202, a sub-woofer 209, a surround left speaker 214, a surround right speaker 215, a surround back left speaker 224, and a surround back right speaker 225. In the particular example of FIG. 2, as with FIG. 1, the surround left and right speakers 214, 215 are dipolar in nature. The surround back left and right speakers 224, 225 are typically spaced relatively far apart behind the listener 207. When a 5.1 encoded soundtrack is played on a 7.1 surround system 200 such as shown in FIG. 2, the surround left and right speakers 214, 215 receive the left and right surround channel information, and the surround back left and right speakers 224, 225 may or may not receive the left and right surround channel information, depending upon how the user has programmed the system 200. In either case, certain anomalies can occur. For example, if the left and right surround channels are monaural, the left/right surround effect can seem to disappear and be replaced by a single central "phantom" sound image 230 at the rear of the listener 207. This effect can be mitigated by the use of adaptive de-correlation, which involves derivation of two substantially de-correlated signals from the single monaural channel in order to provide an improved enveloping surround effect.

Figure 3:
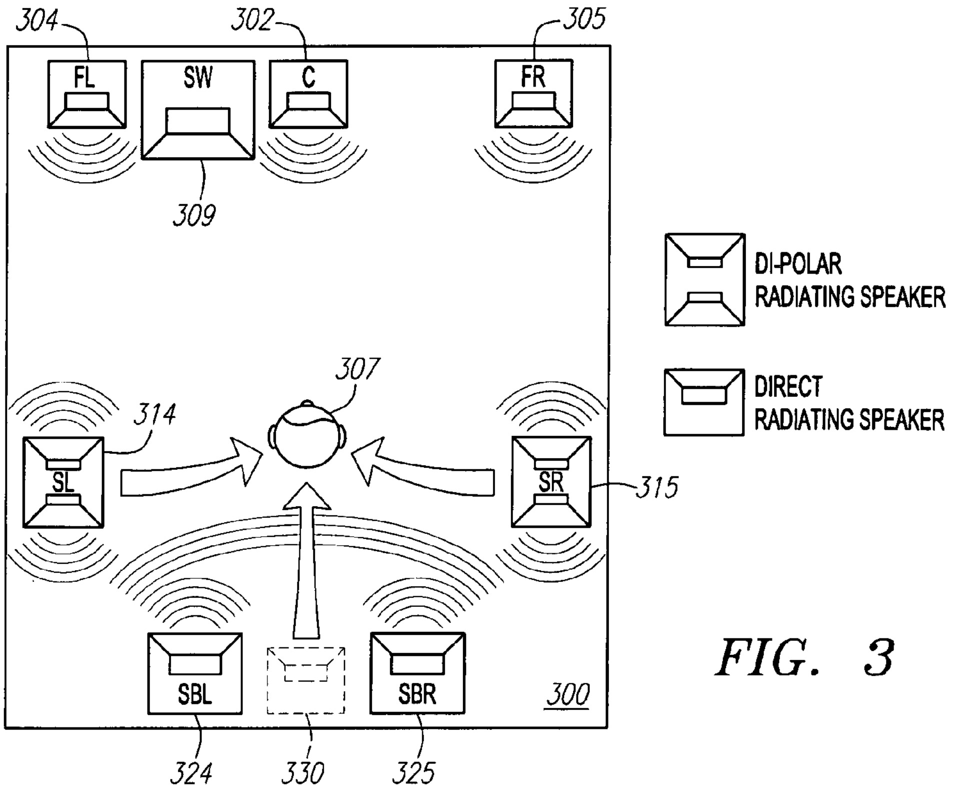
FIG. 3 is a diagram illustrating playback of a 6.1 surround format soundtrack in a 7.1 surround sound system.

FIG. 3 is a diagram illustrating 6.1 surround format playback in a 7.1 surround system. In FIG. 3, the speakers labeled 3*xx* generally correspond to the same speakers labeled 2*xx* in FIG. 2. When a soundtrack in a 6.1 surround format is played on a 7.1 surround system 300 such as shown in FIG. 3, the surround back speakers 324, 325 are fed with identical monaural signals (derived from the single surround back channel in the 6.1 encoding format), which may or may not be delayed with respect to each other to compensate for unequal distances from the optimum listening position. As illustrated in FIG. 3, the identical monaural signals being played through the surround back speakers 324, 325 produces a central "phantom" sound image 330 when the listener is positioned approximately equidistant from them. Reported side effects include "coloration" associated with the phantom sound image 330, which can lead to listener confusion or an unnatural sound, a narrow "sweet spot" (see FIG. 4) due to lack of sound image stability when the listener moves off center from the axis which is equidistant from both surround back speakers 324, 325 (see FIG. 5), and suppression of certain frequency ranges due to cancellations (i.e., nulls) caused by a "comb filter" effect as the sound waves interfere with one another. As a result, the sound quality of a 6.1 surround format soundtrack, when played back in a 7.1 surround system 300, can suffer significantly, particularly for listeners that are not positioned in an optimum listening position.

As previously indicated in the Background section hereof, replay of soundtracks in other multi-channel formats (such as Dolby AC-3, DTS or DVD-Audio) can also suffer from similar effects, depending upon the nature of the signals fed to the different left/right and back surround speakers.

Figure 6:
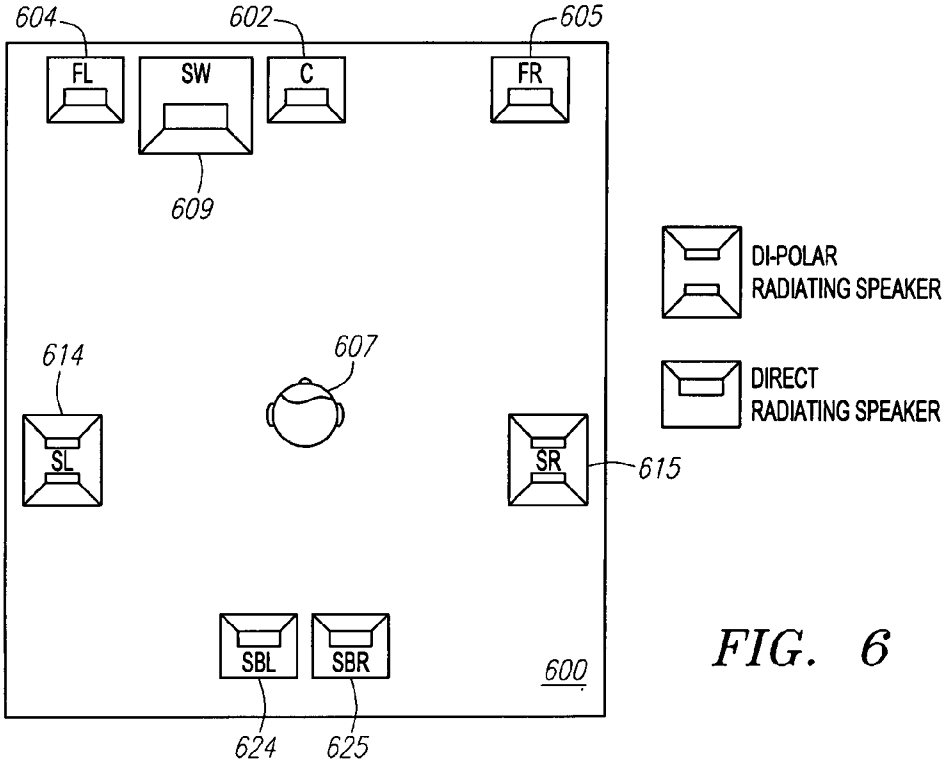
FIG. 6 is a diagram of a speaker configuration for a surround sound system, in accordance with a preferred embodiment as described herein.

FIG. 6 is a diagram showing a speaker configuration for a surround sound system 600 in accordance with a preferred embodiment as described herein. The sound system 600 of FIG. 6 includes, similar to the systems 200 and 300 shown in FIGS. 2 and 3, respectively, front left and right speakers 604, 605, a front center speaker 602, a sub-woofer 609, a surround left speaker 614, and a surround right speaker 615. The sound system 600 further includes a surround back left speaker 624 and a surround back right speaker 625, which are preferably positioned in close proximity to one another, possibly even within the same speaker enclosure. The surround back left and right speakers 624, 625 are preferably identical and may be either dipolar or monopolar in nature, but are shown in FIG. 6 as monopolar. The speaker configuration of the sound system 600 illustrated in FIG. 6, coupled with a preferred sound processing technique, can provide improved sound quality when, for example, playing audio tracks recorded in any of the surround sound or multi-channel formats.

When the sound system 600 of FIG. 6 is used to play a soundtrack recorded in 7.1 surround format, the various left, right, center, and surround left/right channel audio signals are fed to the appropriate individual speakers, as would normally be done with a typical 7.1 surround speaker configuration. However, the surround back left and right speakers 624, 625 preferably receive the surround back right channel audio signal and surround back left channel audio signal after sound processing as further described in more detail later herein.

When, on the other hand, the sound system 600 of FIG. 6 is used to play a soundtrack recorded in 6.1 surround format, the various left, right, center, and surround left/right channel audio signals are again fed to the appropriate individual speakers, as would normally be done with a typical 7.1 surround speaker configuration. Typically, assuming that Surround EX playback is properly selected (e.g., a Surround EX flag is present), the surround back left and right speakers 624, 625 both receive and respond directly to the surround rear channel audio signal. The central rear sound image produced by the closely spaced surround back left and right speakers 624, 625 from the monaural signal (i.e., the surround rear channel audio signal) is stable over a much wider area, as compared to widely spread surround back left and right speakers, and has significantly less "coloration" or unnaturalness than the audio sound produced by such widely spaced rear surround speakers.

Figure 7:
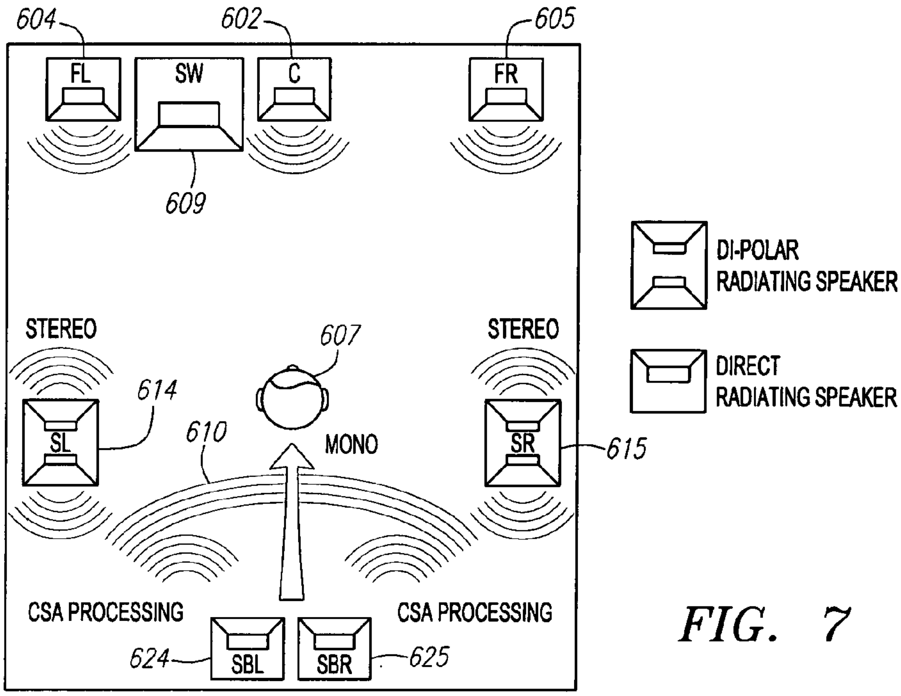
FIG. 7 is a diagram illustrating 6.1 surround format playback in the surround sound system shown in FIG. 6.

In some instances, such as, for example, where the 6.1 Surround soundtrack is matrix-encoded, or where Surround EX processing is not invoked for whatever reason, a somewhat different type of playback may be experienced. In such a case, the sound system may effectively treat the soundtrack as a 5.1 soundtrack, and may send to the surround back left and right speakers 624, 625 the surround left and right channel audio signals, which may be mixed with at least some portion of the monaural channel information (if the soundtrack is matrix encoded). According to a preferred sound system as disclosed herein, the surround back left and right speakers 624, 625 both receive and respond directly to the surround rear channel audio signal, if such information is present, and, after suitable sound processing, as further described herein, to the surround left/right channel audio signals. FIG. 7 illustrates the playback of a 6.1 surround-encoded soundtrack in the sound system 600 of FIG. 6 in such a situation. As shown in FIG. 7, a wide monaural sound image is projected from the surround back left and right speakers 624, 625. The surround left and right channel audio signals are fed to both the surround left and right speakers 614, 615, and to the surround back left and right speakers 624, 625 after sound processing as further described later herein.

When the sound system 600 of FIG. 6 is used to play a soundtrack recorded in 5.1 surround format, the various left, right and center channel audio signals are fed to the appropriate individual speakers, as would normally be done with a typical 7.1 surround speaker configuration. Preferred operation with respect to the surround left and right speakers 614, 615 and surround back left and right speakers 624, 625 depends in part upon the nature of the surround left/right channel audio signals. When the surround left/right channel audio signals are monaural in nature, the sound system 600 preferably uses adaptive de-correlation to provide a de-correlated signal for the side surround speakers 614, 615, and provides a direct feed to the surround back left and right speakers 624, 625 to produce a superior rear central image. However, when the surround left/right channel audio signals are stereo in nature, the surround left/right channel audio signals are fed directly to the surround left and right speakers 614, 615 without adaptive de-correlation, and, if desired, after suitable sound processing as further described herein, to the surround back left and right speakers 624, 625. The surround left and right channel audio signals are processed such that the apparent rear sound image size is increased, and its stability is improved at off-axis listening positions. The appropriately apportioned and summed output of the two side surround speakers 614, 615 and the two surround back speakers 624, 625 creates a near-continuous rear-half sound field, thereby improving the sound experience for listeners over a wider area.

Figure 12:
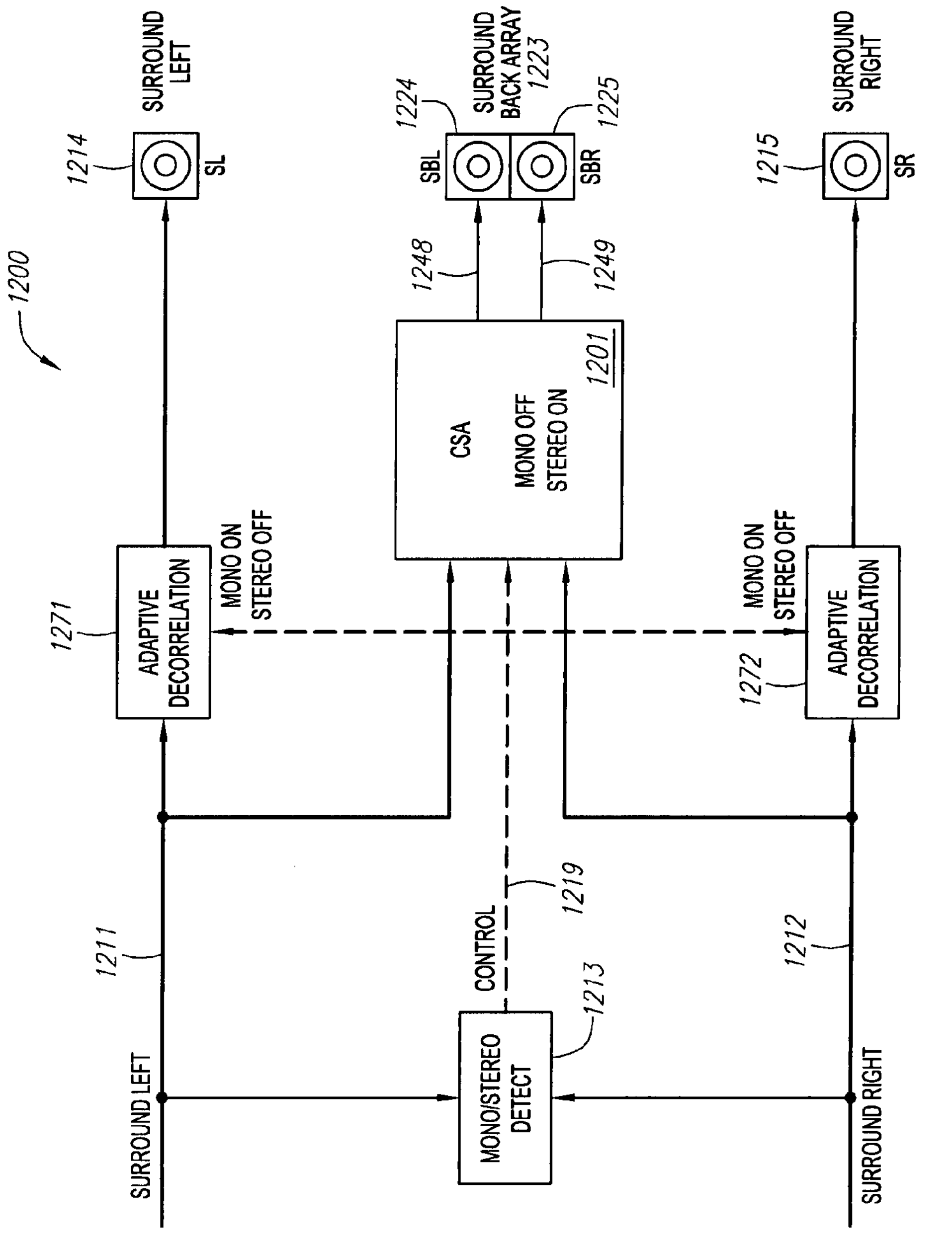
FIG. 12 is a conceptual diagram illustrating processing/operation for 5.1 surround format playback in the context of a surround sound system such as shown, for example, in FIG. 6 or 11.

FIG. 12 is a simplified diagram conceptually illustrating playback of a 5.1 surround format soundtrack in the sound system 600 of FIG. 6, when the sound system 600 is configured to apply the surround left and right channel audio signals 1211, 1212 to the rear surround speakers 1224, 1125. As illustrated in FIG. 12, when the surround left and right channel audio signals 1211, 1212 are monaural, adaptive de-correlation processing (as represented by blocks 1271 and 1272) is activated, and when they are stereo in nature, adaptive sound processing for the rear surround speakers 1224, 1225 (as represented by block 1201) is activated.

More generally, the techniques described herein are capable of producing potentially improved sound for a stereo signal in connection with a speaker configuration that includes two speakers placed in close proximity. Whenever a stereo signal from any encoded program (e.g., surround sound or multi-channel soundtrack), or any audio product or source, is fed directly to the appropriate right and left speakers (e.g., left and right surround speakers) and, after suitable sound processing as further described herein, to the pair of speakers placed in close proximity (e.g., surround back speakers). The pair of closely spaced speakers is thereby capable of generating a sound image of improved stability and quality over a wider area, thus enlarging the optimum listening area and providing greater satisfaction to the listeners.

Figure 8:
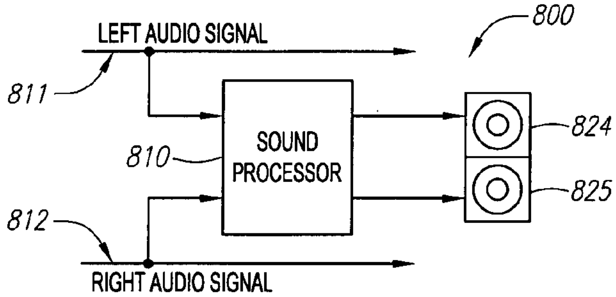
FIG. 8 is a simplified block diagram of a sound processing system in accordance with one or more embodiments as disclosed herein, as may be used, for example, in connection with the speaker configuration illustrated in FIG. 6.

Further details regarding preferred sound processing for closely spaced speakers (such as rear surround speakers 624, 625 in FIG. 6) will now be described. FIG. 8 is a generalized block diagram of a sound processing system 800 in accordance with on embodiment as disclosed herein, as may be used, for example, in connection with the speaker configuration illustrated in FIG. 6, or more generally, in any sound system which utilizes multiple audio channels to provide stereo source signals. As shown in FIG. 8, a left audio signal 811 and right audio signal 812 are provided to a sound processor 810, and then to a pair of closely spaced speakers 824, 825. The left audio signal 811 and right audio signal 812 may also be provided to left and right side (surround or non-surround) speakers, not shown in FIG. 8. In a preferred embodiment, the sound processor 810 acts to "spread" the sound image produced by the two closely spaced speakers 824, 825 by employing a cross-cancellation technique wherein a cancellation signal is derived, for example, from the difference between the left and right audio signals 811, 812. The resulting difference signal is scaled, delayed (if necessary) and spectrally modified before being added to the left channel and, in opposite polarity, to the right channel. The spectral modification to the difference channel preferably takes the form of a low-frequency boost over a specified frequency range, in order to restore the correct timbral balance after the differencing process which causes a loss of bass when the low-frequency signals in each channel are similar. The effect of the sound processor 810 is to enlarge the perceived area and stability of the sound image produced by the speakers 324, 325, and provide an effect of stereo sound despite the close proximity of the speakers 324, 325.

Figures 1, 9:
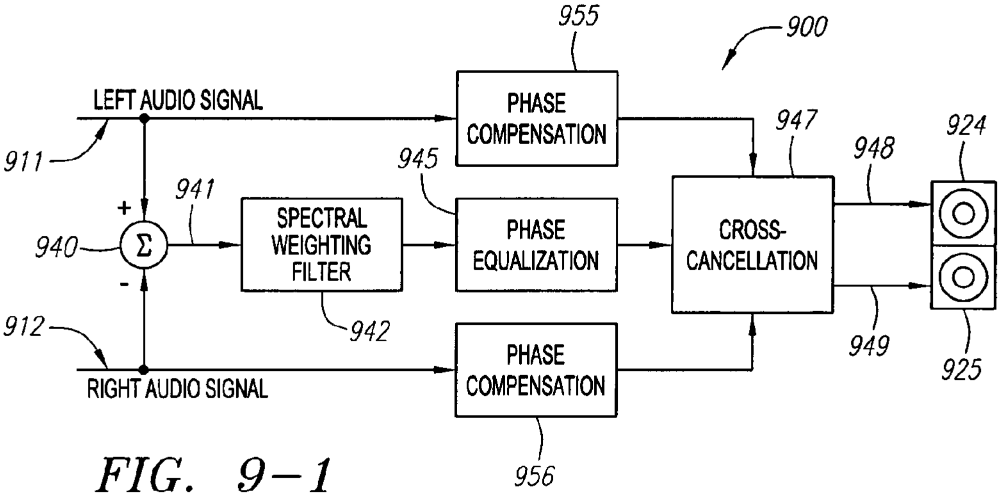
Figures 2, 9:
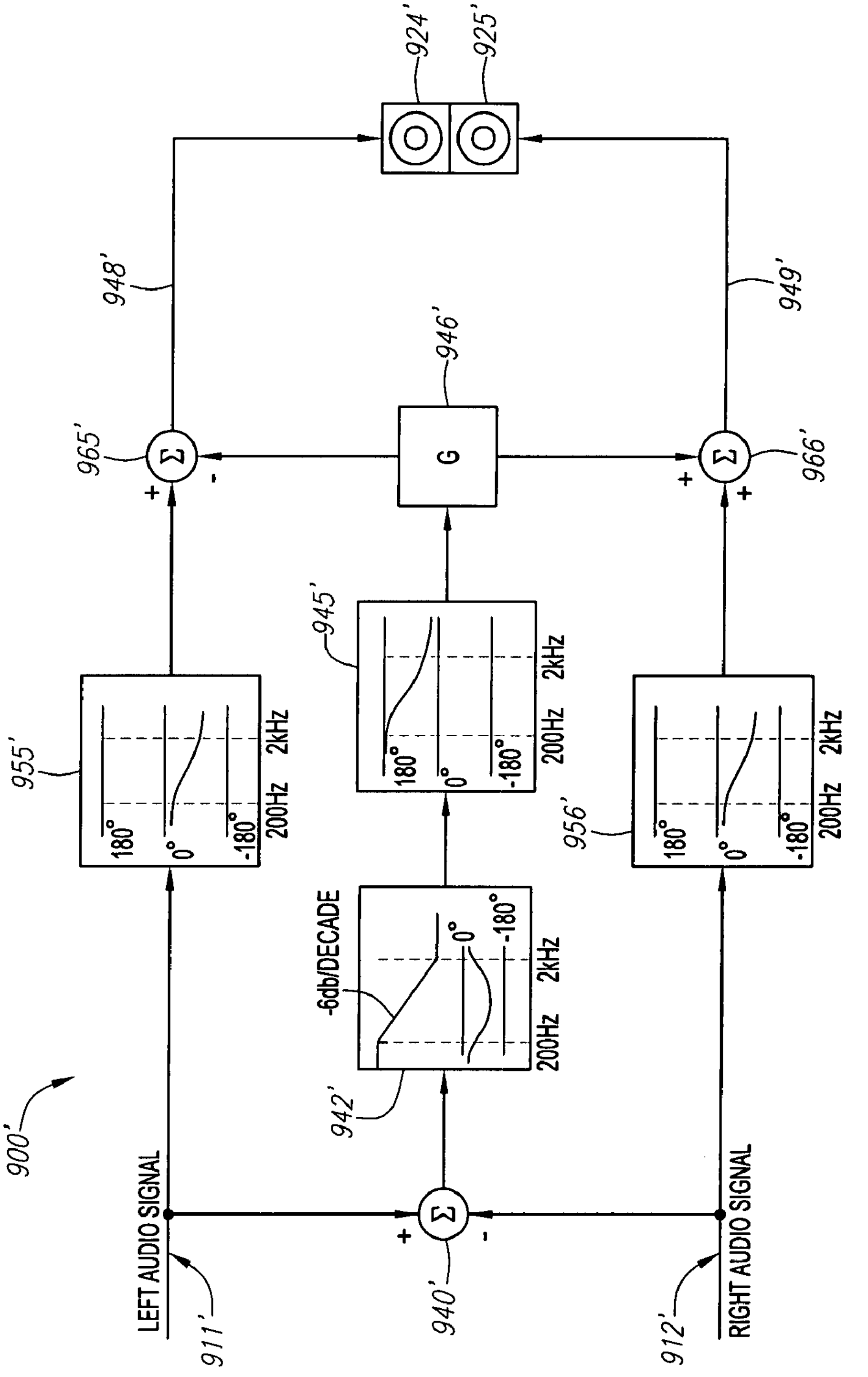

FIG. 9-1 is a more detailed diagram of a sound processing system 900 in accordance with various principles as disclosed herein, and as may be used, for example, in connection with the sound system 600 illustrated in FIG. 6, or more generally, in any sound system which utilizes multiple audio channels to provide stereo source signals. In the sound processing system 900 of FIG. 9-1, a left audio signal 911 and right audio signal 912 are provided from an audio source, and may be fed to other speakers as well (not shown in FIG. 9-1). A difference between the left audio signal 911 and right audio signal 912 is obtained by, e.g., a subtractor 940, and the difference signal 941 is fed to a spectral weighting filter 942, which applies a spectral weighting (and possibly a gain factor) to the difference signal 941. The characteristics of the spectral weighting filter 942 may vary depending upon a number of factors including the desired aural effect, the spacing of the speakers 924, 925 with respect to one another, the taste of the listener, and so on. The output of the spectral weighting filter 942 may be provided to a phase equalizer 945, which compensates for the phase shifting caused by the spectral weighting filter 942 (if non-linear).

In FIG. 9-1, the output of the phase equalizer 945 is provided to a cross-cancellation circuit 947. The cross-cancellation circuit 947 also receives the left audio signal 911 and right audio signal 912, as adjusted by phase compensation circuits 955 and 956, respectively. The phase compensation circuits 955, 956, which may be embodied as, e.g., all-pass filters, preferably shift the phase of their respective input signals (i.e., left and right audio signals 911, 912) in a complementary manner to the phase shifting performed by the phase equalizer 945 (in combination with the phase distortion caused by the spectral weighting filter 924), such that the phase characteristic of the central channel is substantially 180° degrees out-of-phase with the phase characteristic of the left and right channels over the frequency band of interest. The cross-cancellation circuit 947, which may include a pair of summing circuits (one for each channel), then mixes the spectrally-weighted, phase-equalized difference signal, after adjusting for appropriate polarity, with each of the phase-compensated left audio signal 911 and right audio signal 912. The perceived width of the soundstage produced by the pair of speakers 924, 925 can be adjusted by varying the gain of the difference signal path, and/or by modifying the shape of the spectral weighting filter 942.

FIG. 9-2 is a diagram of a sound processing system 900' in general accordance with the principles and layout illustrated in FIG. 9-1, further showing typical examples of possible transfer function characteristics for certain processing blocks. As with FIG. 9-1, in the sound processing system 900' a left audio signal 911' and a right audio signal 912' are provided from an audio source (not shown), and a difference signal 941' is obtained representing the difference between the left audio signal 911' and the right audio signal 912'. The difference signal 941' is fed to a spectral weighting filter 942', which, in the instant example, applies a spectral weighting to the difference signal 941', the characteristics of which are graphically illustrated in the diagram of FIG. 9-2. A more detailed graph of the transfer function characteristics (both gain and phase) of the spectral weighting filter 942' in this example appears in FIG. 15-1. As shown therein, the spectral weighting filter 942' is embodied as a first-order shelf filter with a gain of 0 dB at low frequencies, and turn-over frequencies at approximately 200 Hz and 2000 Hz. If desired, the gain applied by gain/amplifier block 946' can be integrated with the spectral weighting filter 942', or the gain can be applied downstream as illustrated in FIG. 9-2. In any event, as previously noted, the turnover frequencies, amount of gain, slope, and other transfer function characteristics may vary depending upon the desired application and/or overall system characteristics.

A phase equalizer 945' is provided in the center processing channel, and addition phase compensation circuits 955' and 956' in the right and left channels, to ensure that the desired phase relationship is maintained, over the band of interest, between the center channel and the right and left channels. As shown graphically in both FIG. 9-2 and in more detail in FIG. 15-1, the spectral weighting filter 942' in the instant example causes a phase distortion over at least the 200 Hz to 2000 Hz range. The phase equalizer 945' provides no gain, but modifies the overall frequency characteristic of the center channel. The phase compensation circuits 955' and 956' likewise modify the phase characteristics of the left and right channels, respectively. The phase compensation is preferably selected, in the instant example, such that the phase characteristic of the center channel (that is, the combined phase effect of the spectral weighting filter 942' and the phase equalizer 945') is approximately 180° out-of-phase with the phase characteristic of the left and right channels, over the frequency band of interest (in this example, over the 200 Hz to 2000 Hz frequency band). At the same time, the phase characteristic of the left and right channels are preferably remains the same, so that, among other things, monaural signals being played over the left and right channels will have identical phase processing on both channels (and thus maintain proper sound characteristics). Therefore, the phase compensation circuits 955' and 956' preferably are configured to apply identical phase processing to the left and right channels.

Figures 2, 15:
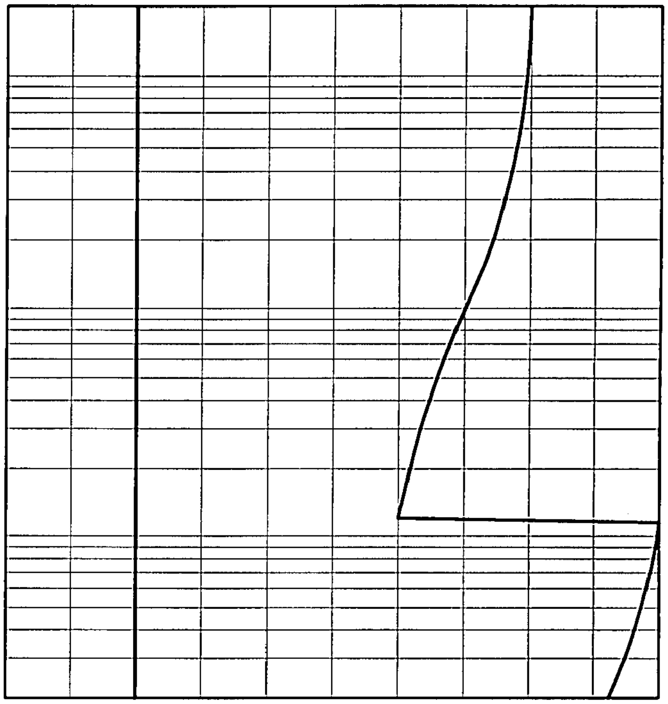
Figures 1, 15:
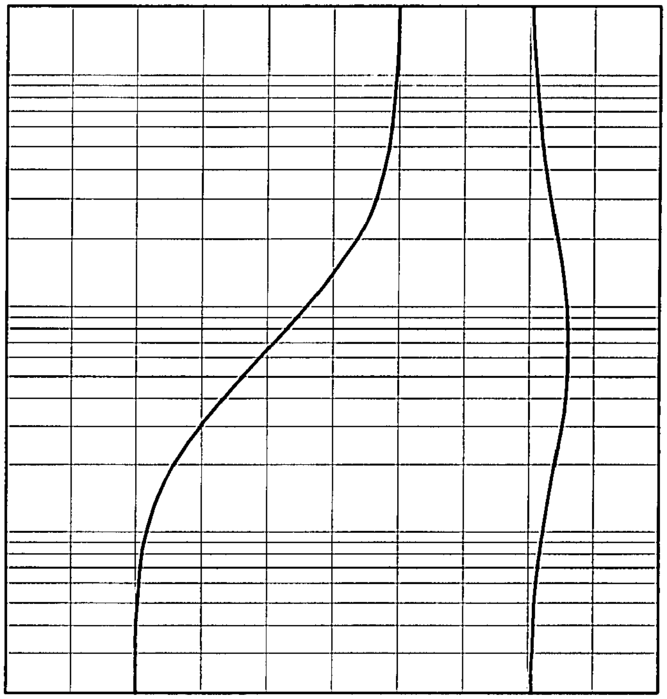
Figures 3, 15:
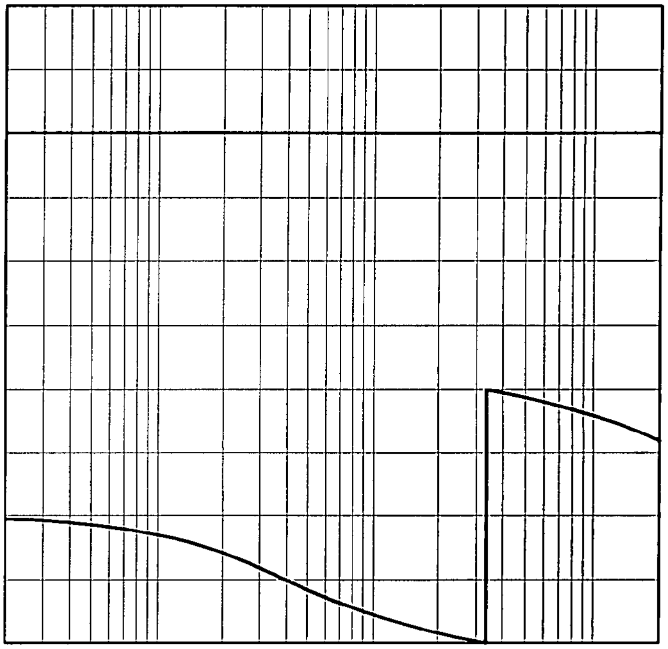

More detailed graphical examples of gain and phase transfer functions (with the gain being zero in this case when the components are embodied as all-pass filters) are illustrated for the center channel phase equalizer 945' in FIG. 15-2 and for the left and right channel phase compensation circuits 955', 956' in FIG. 15-3. In these examples, the phase equalizer 945' is embodied as a second-order all-pass filter (with F=125 Hz and Q=0.12), and the phase compensators 955' 956' are each embodied as second-order all-pass filters (with F=3200 Hz and Q=0.12). A higher Q value may be used to increase the steepness of the phase drop-off, reducing the extent to which the center channel is out-of-phase with the left and right channels at low frequencies (thus minimizing the burden imposed upon the speakers 924', 925').

Figure 11:
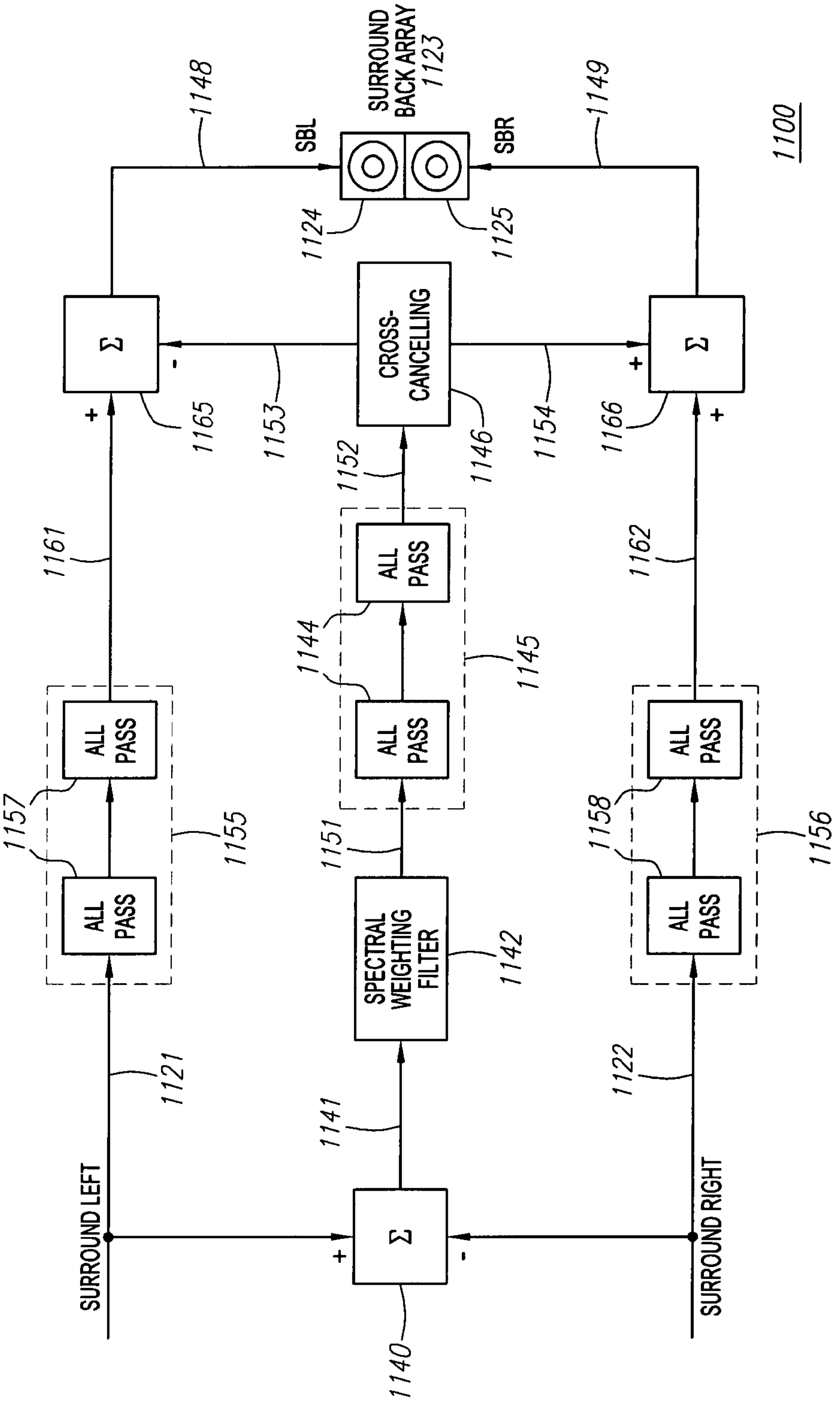
FIG. 11 is a diagram of a sound system in accordance with the general principles of the systems illustrated in FIGS. 8 and 9, as applied in the context of a surround sound system.

FIG. 11 illustrates another implementation of the sound system 900 shown in FIG. 9-1, where all-pass filters 1157, 1158 are used in phase compensation blocks 1155 and 1156, respectively, to provide phase equalization and/or compensation. In FIG. 11, elements labeled with reference numerals "11*xx*" generally correspond to their counterparts labeled "9*xx*" in FIG. 9-1.

Figure 10:
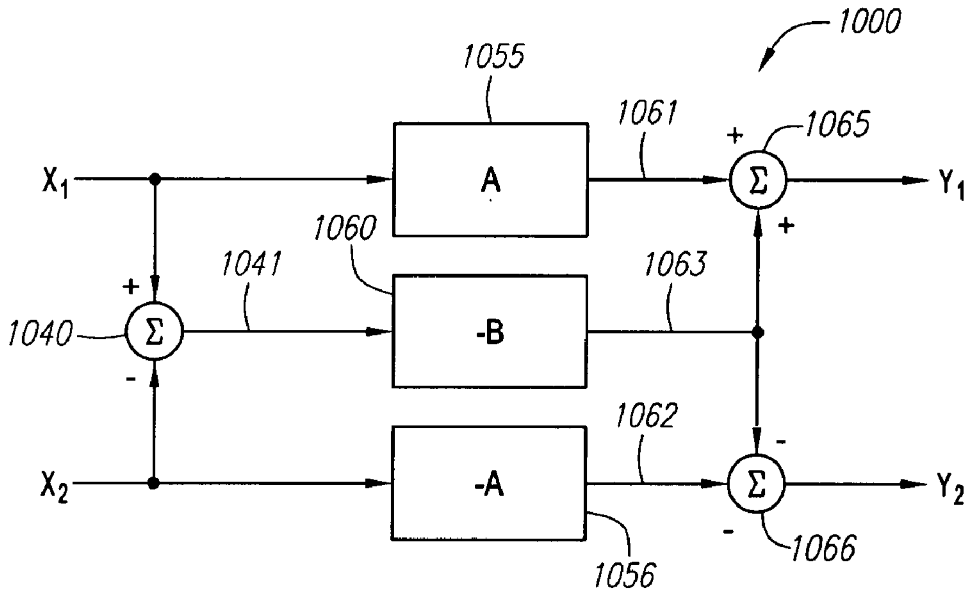
FIG. 10 is a diagram of a sound processing system illustrating representative transfer functions.

FIG. 10 is another diagram of a sound processing system 1000, in accordance with the general principles explained with respect to FIGS. 3 and 9, illustrating representative transfer functions according to an exemplary embodiment as described herein. In the sound processing system 1000 shown in FIG. 10, input audio signals X1 and X2 (e.g., left and right audio signals) are processed along two parallel paths, and the resultants individually summed together and provided as output signals Y1 and Y2, respectively (which may be fed to a pair of speakers, e.g., left and right speakers located in close proximity). A difference between the input audio signals X1 and X2 is obtained from a subtractor 1040, which provides the resulting difference signal 1040 to a processing block 1060 having a transfer function −B. The first input audio signal X1 is also fed to a processing block 1055 having a transfer function A, and the output of processing block 1055 is added together with the output of processing block 1060 and fed as the first output signal Y1. Likewise, the second input audio signal X2 is fed to a processing block 1056 having a transfer function −A (i.e., the inverse of the transfer function A of processing block 1055), and the output of processing block 1056 is inverted and added together with the inverted output of processing block 1060, then fed as the second output signal Y2. The overall relationship between the inputs and the outputs of the FIG. 10 sound processing system 1000 can be expressed as:

$$A\left(\begin{bmatrix}1 & 0\\ 0 & 1\end{bmatrix}+B\begin{bmatrix}-1 & 1\\ 1 & -1\end{bmatrix}\right)\begin{bmatrix}x_1\\ x_2\end{bmatrix}=\begin{bmatrix}y_1\\ y_2\end{bmatrix}$$

Figure 4:
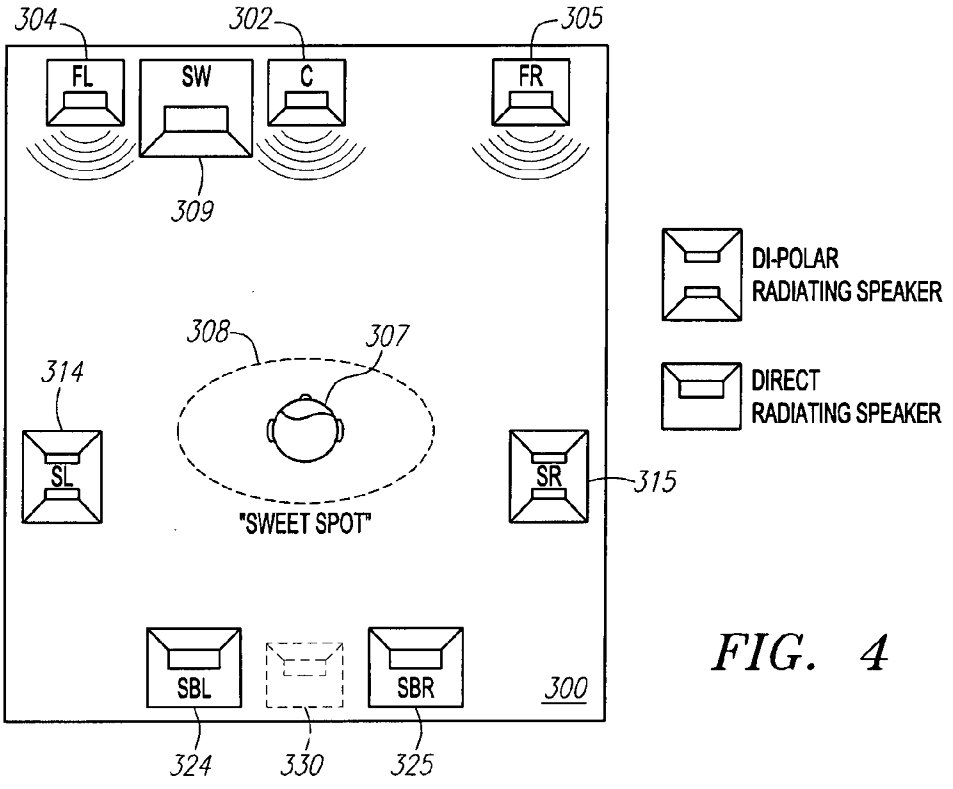
FIG. 4 is a diagram illustrating the concept of a "sweet spot" in the context of 6.1 surround format playback in a 7.1 surround sound system.
Figure 5:
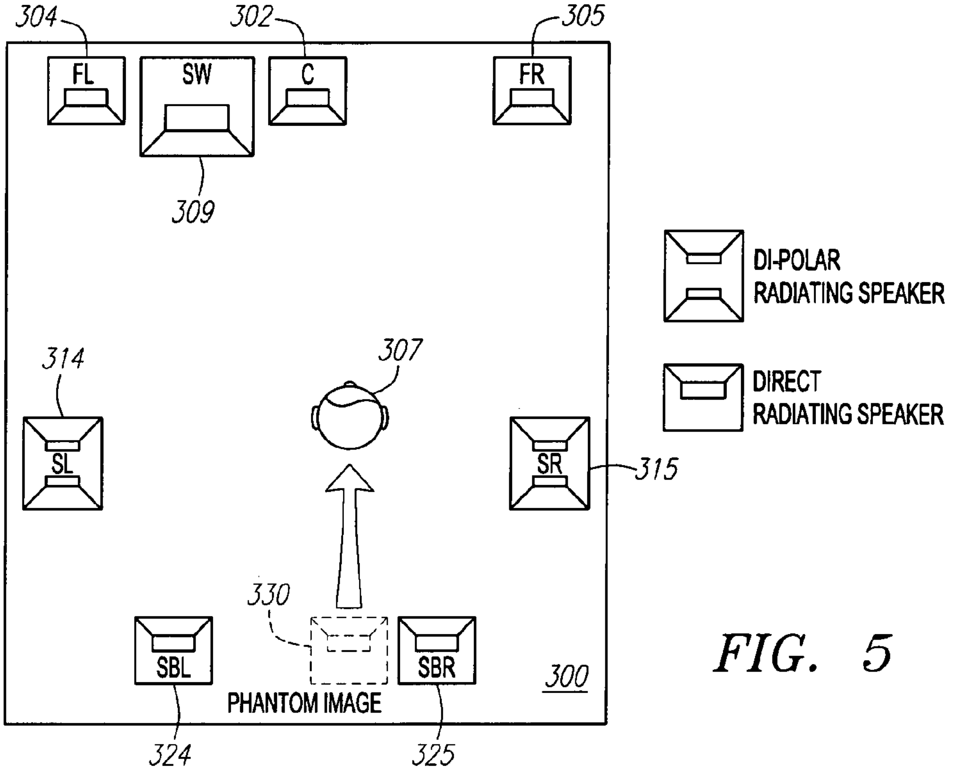
FIG. 5 is a diagram illustrating movement of the phantom image in conjunction with the listener's movement.

In a preferred embodiment, the transfer function −B of processing block 1060 represents the combined transfer functions of a spectral weighting filter of desired characteristics and a phase equalizer, such as illustrated by the difference path in the sound processing system 400 of FIG. 4. Also in a preferred embodiment, the transfer functions A and −A of processing blocks 1055 and 1056, respectively, each represent the transfer function of a phase compensation network that performs a complementary phase shifting to compensate for the phase effects caused by the processing block 1060. The polarities in FIG. 10 are selected so that appropriate cross-cancellation will be attained.

In a preferred embodiment, input signals X1 and X2 represent the Z-transforms of the left and right audio channel inputs, and Y1 and Y2 represent the corresponding Z-transforms of the left and right channel outputs which feed the pair of speakers (e.g., left and right speakers) located in close proximity. The transfer functions A, −A, and B may be represented in terms of z, and are determined in part by the sampling frequency $F_s$ associated with processing in the digital domain. According to a particular embodiment, blocks 1055 and 1056 are each second-order all-pass filters with f=3200 Hertz, Q=0.12, and may, in one example, possess the following transfer function characteristics based upon representative examples of the sampling frequency $F_s$:

$$\text{For } F_S = 48 \text{ KHz}, \quad A(z) = \frac{-0.2578123 - 0.6780222z^{-1} + z^{-2}}{1 - 0.6780222z^{-1} - 0.2578123z^{-2}}$$

$$\text{For } F_S = 44.1 \text{ KHz}, \quad A(z) = \frac{-0.2944196 - 0.633509z^{-1} + z^{-2}}{1 - 0.633509z^{-1} - 0.2944196z^{-2}}$$

$$\text{For } F_S = 32 \text{ KHz}, \quad A(z) = \frac{-0.4201395 - 0.469117z^{-1} + z^{-2}}{1 - 0.469117z^{-1} - 0.4201395z^{-2}}$$

In this particular embodiment, block 1060 may be a first-order shelf having a gain of 0 dB at low frequencies and turn-over frequencies of 200 Hertz and 2 KHz in cascade with a second-order all pass filter, with f=125 Hz, Q=0.12, and may, in one example, possess the following transfer function characteristics based upon representative examples of the sampling frequency $F_s$:

For $F_S$ = 48 KHz, $$B(z) = G \times \frac{0.1116288 - 0.0857871z^{-1}}{1 - 0.9741583z^{-1}} \times \frac{0.8723543 - 1.872104z^{-1} + z^{-2}}{1 - 1.872104z^{-1} + 0.8723543z^{-2}}$$

For $F_S$ = 44.1 KHz, $$B(z) = G \times \frac{0.1126427 - 0.0845478z^{-1}}{1 - 0.9719051z^{-1}} \times \frac{0.8618468 - 1.861552z^{-1} + z^{-2}}{1 - 1.861552z^{-1} + 0.8618468z^{-2}}$$

For $F_S$ = 32 KHz, $$B(z) = G \times \frac{0.1173312 - 0.0788175z^{-1}}{1 - 0.9614863z^{-1}} \times \frac{0.814462 - 1.813915z^{-1} + z^{-2}}{1 - 1.813915z^{-1} + 0.814462z^{-2}}$$

A gain factor may also be included in block 1060, or else may be provided in the same path but as a different block or element. The gain may be determined for a particular application by experimentation, but is generally expected to be optimal in the range of 10–15 dB. In one embodiment, for example, the gain factor is 12 dB.

Figure 14:
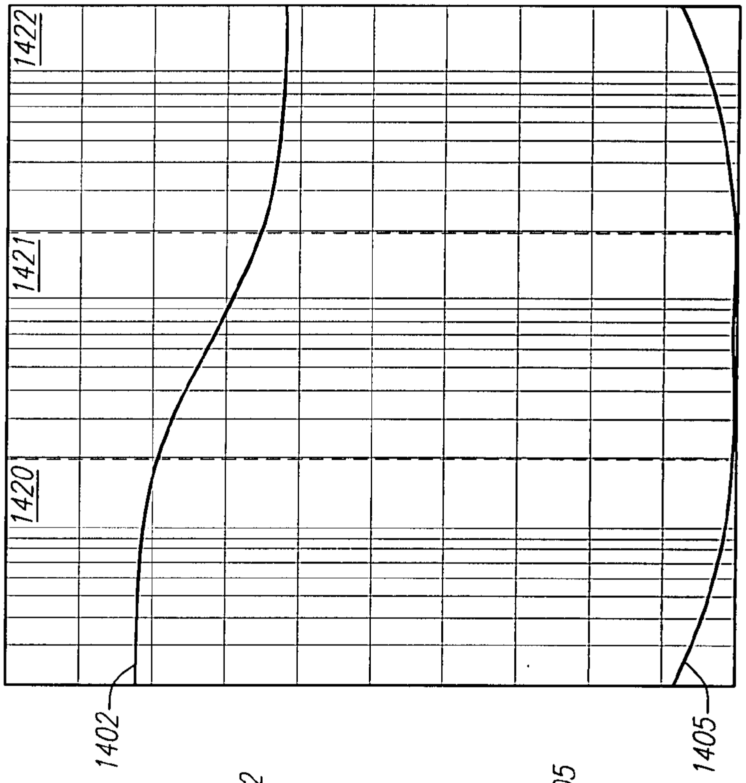
FIGS. 13 and 14 are graphs illustrating examples of frequency response and phase transfer functions for a sound processing system having particular spectral weighting and other characteristics.
Figure 13:
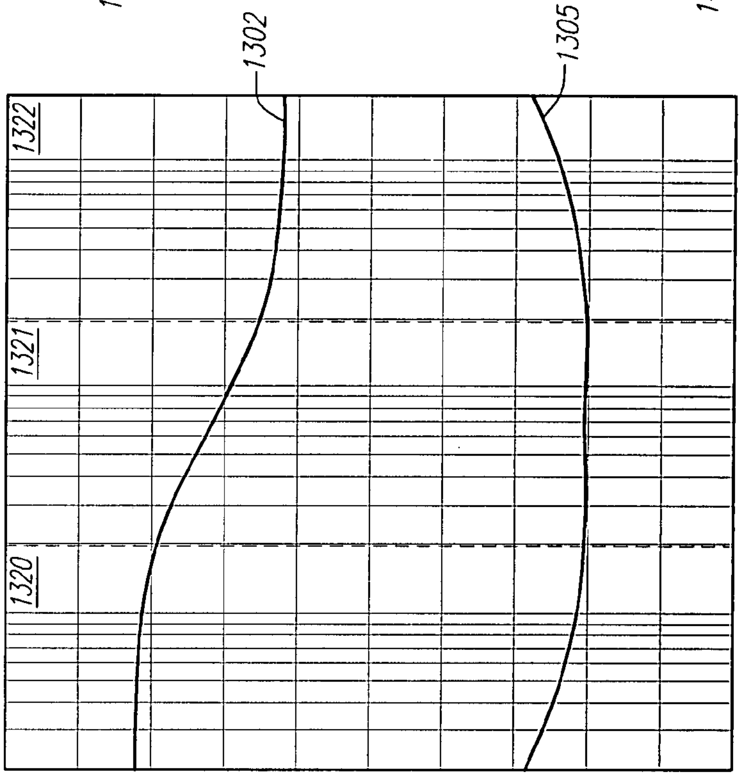

FIGS. 13 and 14 are graphs illustrating examples of frequency response and phase transfer functions for a sound processing system in accordance with FIG. 10 and having particular spectral weighting, equalization and phase compensation characteristics. FIG. 13 illustrates a frequency response transfer function 1302 and phase transfer function 1305 for −B/A, which represents the transfer function of the difference channel (−B) and the first input channel (X1) with +12 dB of gain added. As shown in FIG. 13, the frequency response transfer function 1302 exhibits a relatively flat gain in a first region 1320 of bass frequencies (in this example, up to about 200 Hertz), a decreasing gain in a second region 1321 of mid-range frequencies (in this example, from about 200 Hertz to about 2 KHz), and then a relatively flat gain again in a third region 1322 of high frequencies (in this example, above 2 KHz). The phase response transfer function 1305 indicates that in the second region 1321 of mid-range frequencies (i.e., between about 200 Hertz and 2 KHz) the output signal remains substantially in phase.

FIG. 14 illustrates a frequency response transfer function 1402 and phase transfer function 1405 for −B/−A, which represents the transfer function of the difference channel (−B) and the first input channel (X2) with +12 dB of gain added. In FIG. 14, as with FIG. 13, the frequency response transfer function 1402 exhibits a relatively flat gain in a first region 1420 of bass frequencies (in this example, up to about 200 Hertz), a decreasing gain in a second region 1421 of mid-range frequencies (in this example, from about 200 Hertz to about 2 KHz), and then a relatively flat gain again in a third region 1422 of high frequencies (in this example, above 2 KHz). The phase response transfer function 1405 indicates that in the second region 1421 of mid-range frequencies (i.e., between about 200 Hertz and 2 KHz) the output signal is substantially inverted in phase (i.e., at 180 degrees).

As noted, the output signals Y1, Y2 are preferably provided to a pair of speakers located in close proximity. The transfer functions A, −A, and B are examples selected for the situation where the speakers are located substantially adjacent to one another. However, benefits may be attained in the system 1000 of FIG. 10, or other embodiments described herein, where the pair of speakers are not immediately adjacent, but are nevertheless in close proximity with one another.

Figure 16:
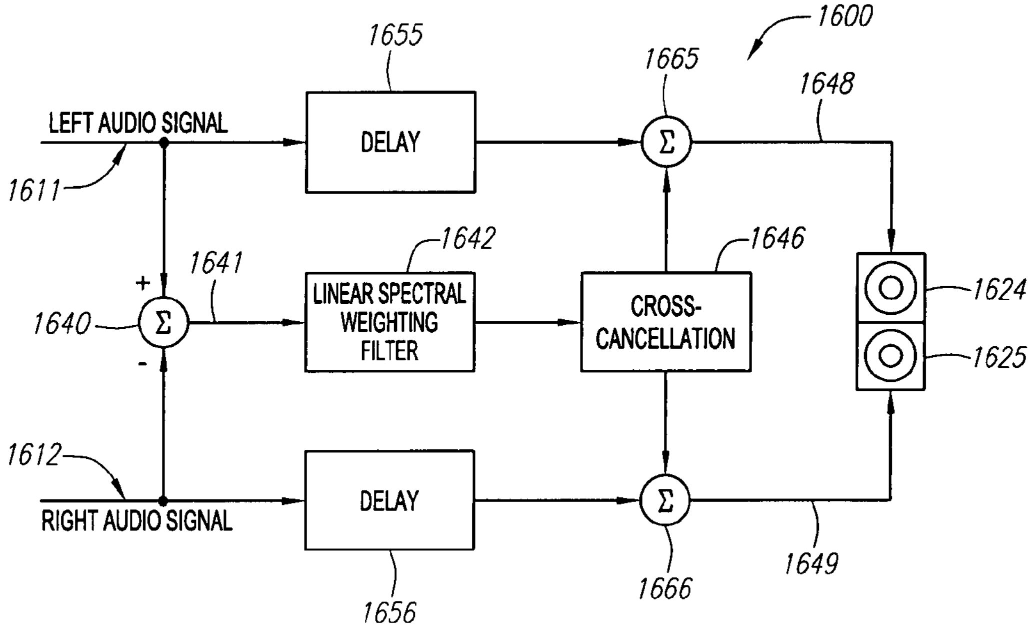
FIG. 16 is a diagram of a sound processor employing a linear spectral weighting filter.

FIG. 16 is a diagram of a sound processing system 1600 in accordance with an alternative embodiment as described herein, employing a linear spectral weighting filter. In the sound processing system 1600 of FIG. 16, a left audio signal 1611 and right audio signal 1612 are processed to derive a pair of processed audio signals 1648, 1649 which are applied to a pair of closely spaced speakers 1624, 1625 (e.g., left and right speakers). The left and right audio signals 1611, 1612 are operated upon by a subtractor 1640, which outputs a difference signal 1641 representing a difference between the left and right audio signals 1611, 1612. The difference signal 1641 is fed to a spectral weighting filter 1642 having a linear phase characteristic. The spectral weighting filter 1642 may have frequency response characteristics in general accordance, for example, with the transfer function illustrated in FIG. 7A or 7B. Because the spectral weighting filter 1642 has a linear phase characteristic, phase equalization and compensation are not necessary. Therefore, the output of the spectral weighting filter 1642 may be provided directly to a cross-cancellation circuit 1646, which then mixes the spectrally weighted signal with each of the left and right audio channels before applying them to the speakers 1624, 1625. To compensate for the delay caused by the spectral weighting filter 1642, delay components 1655 and 1656 may be added along the left and right channel paths, respectively. The delay components 1655, 1656 preferably have a delay characteristic equal to the latency of the linear spectral weighting filter 1642.

The amount of cross-cancellation provided by the sound processing in various embodiments generally determines the amount of "spread" of the sound image. If too much cross-cancellation is applied, then the resulting sound can seem clanky or echoey. If, on the other hand, too little cross-cancellation is applied, then the sound image may not be sufficiently widened or stabilized.

The pair of speakers (e.g., speakers 824 and 825 in FIG. 8, or closely spaced speakers in other embodiments described herein) which receive the sound processed information are preferably located immediately adjacent to one another; however, they may also be physically separated while still providing benefits of enlarged sound image, increased stability, and so on. Generally, the maximum acceptable separation of the pair of speakers can be determined by experimentation, but performance may gradually decline as the speakers are moved farther apart from one another. Preferably, the two speakers are placed no further apart than a distance that is comparable with the wavelength of the highest frequency that is intended to be radiated by the speakers. For a maximum frequency of 2 kHz, this separation would correspond to a center-to-center spacing of about 6 inches between the two speakers. However, ideally the two speakers are placed immediately next to one another, in order to attain the maximum benefit from the sound processing techniques as described herein.

In various embodiments as described herein, improved sound quality results from a stereo sound image that has stability over a larger area than would otherwise be experienced with, e.g., speakers spaced far apart without comparable sound processing. Consequently, the audio product (e.g., soundtrack) can be enjoyed with optimal or improved sound over a larger area, and by more listeners who are able to experience improved sound quality even when positioned elsewhere than the center of the speaker arrangement. Thus, for example, a home theater surround sound system may be capable of providing quality sound to a greater number of listeners, not all of whom need to be positioned in the center of the speaker arrangement in order to enjoy the playback of the particular audio product.

In any of the foregoing embodiments, the audio product from which the various audio source signals are derived, before distribution to the various speakers or other system components, may comprise any audio work of any nature, such as, for example, a musical piece, a soundtrack to an audio-visual work (such as a DVD or other digitally recorded medium), or any other source or content having an audio component. The audio product may be read from a recorded medium, such as a DVD, cassette, compact disc, CD-ROM, or else may be received wirelessly, in any available format, from a broadcast or point-to-point transmission. The audio product preferably has at least left channel and right channel information (whether or not encoded), but may also include additional channels and may, for example, be encoded in a surround sound or other multi-channel format, such as Dolby-AC3, DTS, DVD-Audio, etc. The audio product may also comprise digital files stored, temporarily or permanently, in any format used for audio playback, such as, for example, an MP3 format or a digital multi-media format.

The various embodiments described herein can be implemented using either digital or analog techniques, or any combination thereof. The term "circuit" as used herein is meant broadly to encompass analog components, discrete digital components, microprocessor-based or digital signal processing (DSP), or any combination thereof. The invention is not to be limited by the particular manner in which the operations of the various sound processing embodiments are carried out.

While examples have been provided herein of certain preferred or exemplary filter characteristics, transfer functions, and so on, it will be understood that the particular characteristics of any of the system components may vary depending on the particular implementation, speaker type, relative speaker spacing, environmental conditions, and other such factors. Therefore, any specific characteristics provided herein are meant to be illustrative and not limiting. Moreover, certain components, such as the spectral weighting filter described herein with respect to various embodiments, may be programmable so as to allow tailoring to suit individual sound taste.

The spectral weighting filter in the various embodiments described herein may provide spectral weighting over a band smaller or larger than the 200 Hertz to 2 KHz band. If the selected frequency band for spectral weighting is too large, then saturation may occur or clipping may result, while if the selected frequency band is too small, then the spreading effect may be inadequate. Also, if cross-cancellation is not mitigated at higher frequencies, as it is in the spectral weighting filters illustrated in certain embodiments herein, then a comb filter effect might result which will cause nulls at certain frequencies. Therefore, the spectral weighting frequency band, and the particular spectral weighting shape, is preferably selected to take account of the physical limitations of the speakers and electronic components, as well as the overall quality and effect of the speaker output.

While certain system components are described as being "connected" to one another, it should be understood that such language encompasses any type of communication or transference of data, whether or not the components are actually physically connected to one another, or else whether intervening elements are present. It will be understood that various additional circuit or system components may be added without departing from teachings provided herein.

Certain embodiments of the invention may find application in a variety of contexts other than home theater or surround sound systems. For example, implementations of the invention may, in some circumstances, be applicable to personal computer systems (e.g., configured to play audio tracks, multi-media presentations, or video games with "three-dimensional" or multi-channel sound), automobile or vehicular audio systems, portable stereos, televisions, radios, and any other context in which sound reproduction is desired. Certain embodiments may find particular utility in situations in which possible speaker locations are limited and/or the maximum spacing between left and right speakers is severel limited, but where two adjacent or closely spaced speakers could be achieved. For example, the pair of closely spaced left and right speakers may be part of an integrated portable stereo unit, or else may be located atop or beneath a computer monitor, etc.

In some embodiments, the pair of closely spaced speakers may be forced to work harder than they would without cross-cancellation, because the cross-mixing of left and right signals requires that the speakers reproduce out-of-phase sound waves. To compensate for this effect, it may, for example, be desirable in some embodiments to increase the size of the amplifier(s) feeding the audio signals to the pair of closely spaced speakers.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A sound system, comprising:

a left speaker and a right speaker located in close proximity;

a left channel audio signal;

a right channel audio signal; and a sound processor receiving as inputs said left channel audio signal and said right channel audio signal, said sound processor configured to cross-cancel a spectrally weighted stereo difference signal with said left channel audio signal and said right channel audio signal prior to applying said left channel audio signal and said right channel audio signal to said left speaker and said right speaker, respectively;

wherein said sound processor further comprises a phase equalizer for equalizing the phase of said spectrally weighted stereo difference signal prior to cross-cancellation, and a plurality of phase compensators, having a phase characteristic complementary to said phase equalizer and said spectral weighting filter over a frequency band of desired cross-cancellation, placed in series along each of said left channel audio signal and right channel audio signal, respectively, prior to cross-cancellation.

2. The sound system of claim 1, wherein said sound processor is configured to generate a difference signal representing a difference between said left channel audio signal and said right channel audio signal, and to apply a spectral weighting to said difference signal thereby generating said spectrally weighted signal.

3. The sound system of claim 2, wherein said sound processor comprises a subtractor for generating said difference signal.

4. The sound system of claim 2, wherein said sound processor comprises a spectral weighting filter for applying said spectral weighting to said difference signal, said spectral weighting filter being characterized by a first filter region of relatively level gain, a second filter region having a generally decreasing gain with increasing frequency, and a third filter region of relatively level gain.

5. The sound system of claim 4, wherein said spectral weighting filter is further characterized by a roll-off from said first filter region to said second filter region at approximately 200 Hertz.

6. The sound system of claim 5, wherein said spectral weighting filter is further characterized by a boundary between said second filter region and said third filter region at approximated 2 KHz.

7. The sound system of claim 2, wherein said sound processor comprises a linear filter for applying the spectral weighting to said difference signal.

8. The sound system of claim 1, wherein said phase equalizer comprises a plurality of all pass filters collectively having a first phase transfer function, and wherein each of said phase compensatory comprises a plurality of all pass filters collectively having a second phase transfer function complementary to a combined phase characteristic of said phase equalizer and said spectral weighting filter over a frequency band of desired cross-cancellation.

9. The sound system of claim 1, wherein said phase equalizer comprises a second order filter.

10. The sound system of claim 1, wherein said left channel audio signal comprises a surround left channel audio signal coupled to a surround left speaker, wherein said right channel audio signal comprises a surround right channel audio signal which is coupled to a surround right speaker, and wherein said left speaker and said right speaker comprise a surround back left speaker and a surround back right speaker, respectively, for utilization in a surround sound stereo system.

11. The sound system of claim 1, wherein said sound processor is implemented in whole or in part in the digital domain.

12. A system for adaptive sound reproduction in a manner so as to enlarge the perceived area and stability of a stereo sound image, comprising:

a left speaker and a right speaker located in close proximity;

a left channel audio signal;

a right channel audio signal;

a subtractor receiving as inputs said left channel audio signal and right channel audio signal, and outputting a difference signal representing a difference between said left channel audio signal and said right channel audio signal;

a spectral weighting filter receiving said difference signal as an input and outputting a spectrally weighted signal;

a cross-cancellation circuit for mixing said spectrally weighted signal with said left channel audio signal and said right channel audio signal, thereby generating a first speaker signal for said left speaker and a second speaker signal for said right speaker;

a phase equalizer interposed between said spectral weighting filter and said cross-cancellation circuit;

a first phase compensator interposed between said left channel audio signal and said cross-cancellation circuit, said first phase compensator having a phase characteristic complementary to a combined phase characteristic of said phase equalizer and said spectral weighting filter; and a second phase compensator interposed between said right channel audio signal and said cross-cancellation circuit, said second phase compensator having a phase characteristic complementary to said combined phase characteristic.

13. The system of claim 12, wherein said spectral weighting filter is characterized by a first filter region of relatively level gain, a second filter region having a generally decreasing gain with increasing frequency, and a third filter region of relatively level gain.

14. The system of claim 13, wherein said spectral weighting filter is further characterized by a roll-off from said first filter region to said second filter region at approximately 200 Hertz.

15. The system of claim 14, wherein said spectral weighting filter is further characterized by a boundary between said second filter region and said third filter region at approximately 2 KHz.

16. The system of claim 12, wherein said phase equalizer comprises a plurality of all pass filters, and wherein said first phase compensator and said second phase compensator each comprises a plurality of all pass filters having a substantially identical phase transfer function.

17. The system of claim 12, wherein said phase equalizer comprises a second order filter.

18. The system of claim 12, wherein said spectral weighting filter comprises a linear filter.

19. The system of claim 12, wherein said left channel audio signal comprises a surround left channel audio signal which is electrically connected to a surround left speaker, wherein said right channel audio signal comprises a surround right channel audio signal which is electrically connected to a surround right speaker, and wherein said first speaker and said second speaker comprise a surround back left speaker and a surround back right speaker, respectively, for utilization in a surround sound stereo system.

20. The system of claim 12, wherein one or more of said subtractor circuit, spectral weighting filter, and cross-cancellation circuit is implemented in whole or in part in the digital domain.

21. A method of sound reproduction, comprising the steps of:

placing a left speaker and a right speaker in close proximity;

receiving a left channel audio signal;

receiving a right channel audio signal;

generating a difference signal representing a difference between said left channel audio signal and said right channel audio signal;

applying a spectral weighting to said difference signal thereby generating a spectrally weighted signal;

cross-canceling said spectrally weighted signal with said left channel audio signal and said right channel audio signal, thereby generating a first speaker signal for said left speaker and a second speaker signal for said right speaker;

performing phase equalizatlon on said difference signal prior to said step of cross-canceling said spectrally weighted signal with said left channel audio signal and said right channel audio signal; and performing phase compensation on each of said left channel audio signal and right channel audio signal to compensate for the spectral weighting and phase equalization performed on said difference signal;

wherein said step of performing phase equalization on said difference signal is carried out using a first plurality of all pass filters collectively having a first phase transfer function, and wherein said step of performing phase compensation on each of said left channel audio signal and right channel audio signal is carried out using a second and third plurality of all pass filters, said second plurality of all pass filters and said third plurality of all pass filters each having a collective phase transfer function complementary to a combined phase transfer function of said first phase transfer function and a spectral weighting phase transfer function associated with the step of applying spectral weighting to said difference signal.

22. The method of claim 21, wherein said step of generating said difference signal is carried out using a subtractor.

23. The method of claim 21, wherein said step of applying said spectral weighting to said difference signal is carried out using a spectral weighting filter, said spectral weighting filter being characterized by a first filter region of relatively level gain, a second filter region having a generally decreasing gain with increasing frequency, and a third filter region of relatively level gain.

24. The method of claim 23, wherein said spectral weighting filter is further characterized by a roll-off from said first filter region to said second filter region at approximately 200 Hertz.

25. The method of claim 24, wherein said spectral weighting filter is further characterized by a boundary between said second filter region and said third filter region at approximately 2 KHz.

26. The method of claim 21, wherein said step of performing phase equalization is carried out using a second order filter.

27. The method of claim 21, wherein said step of applying said spectral weighting to said difference signal is carried out using a linear filter.

28. The method of claim 21, wherein said left channel audio signal comprises a surround left channel audio signal which is coupled to a surround left speaker, wherein said right channel audio signal comprises a surround right channel audio signal which is coupled to a surround right speaker, and wherein said left speaker and said right speaker comprise a surround back left speaker and a surround back right speaker, respectively, for utilization in a surround sound stereo system.

29. The method of claim 21, wherein one or more of said steps of generating said difference signal, applying a spectral weighting to said difference signal, and cross-canceling said spectrally weighted signal with said left channel audio signal and said right channel audio signal is carried out in whole or in part in the digital domain.

30. A method for adaptively reproducing sound in a manner so as to enlarge the perceived area end stability of a stereo sound image, the method comprising the steps of:

placing a left speaker and a right speaker in close proximity;

receiving a left channel audio signal;

receiving a right channel audio signal;

generating a spectrally weighted difference signal by obtaining a difference signal representing a difference between said left channel audio signal and said right channel audio signal, and applying said difference signal to a spectral weighting filter; and cross-canceling said spectrally weighted stereo difference signal with said left channel audio signal and said right channel audio signal prior to applying said left channel audio signal and said right channel audio signal to said left speaker and said right speaker, respectively, said spectrally weighted difference signal derived from said left channel audio signal and said right channel audio signal; and performing phase equalization on an output of said spectral weighting filter prior to said step of cross-canceling said spectrally weighted stereo difference signal with said left channel audio signal and said right channel audio signal;

wherein said step of performing phase equalization on said output of said spectral weighting filter is carried out using a first plurality of all pass filter, and wherein said step of performing phase compensation on each of said left channel audio signal and right channel audio signal is carried out using a second and third plurality of all pass filters.

31. The method of claim 30, wherein said spectral weighting filter is characterized by a first filter region of relatively level gain, a second filter region having a generally decreasing gain with increasing frequency, and a third filter region of relatively level gain.

32. The method of claim 31, wherein said spectral weighting filter is further characterized by a roll-off from said first filter region to said second filter region at approximately 200 Hertz.

33. The method of claim 32, wherein said spectral weighting filter is further characterized by a boundary between said second filter region and said third filter region at approximately 2 KHz.

34. The method of claim 30, further comprising the step of performing phase compensation on each of said left channel audio signal and right channel audio signal to compensate for said step of performing phase equalization on said output of said spectral weighting filter.

35. The method of claim 30, wherein said step of performing phase equalization is carried out using a second order filter.

36. The method of claim 30, wherein said spectral weighting filter comprises a linear filter.

37. The method of claim 30, wherein said left channel audio signal comprises a surround left channel audio signal which is coupled to a surround left speaker, wherein said right channel audio signal comprises a surround right channel audio signal which is also fed to a surround right speaker, and wherein said left speaker and said right speaker comprise a surround back left speaker and a surround back right speaker, respectively, for utilization in a surround sound stereo system.

38. A sound reproduction system for a surround sound stereophonic system, comprising:

a surround left speaker;

a surround right speaker;

a pair of surround back speakers located in close proximity;

a surround left channel audio signal electrically connected to said surround left speaker;

a surround right channel audio signal electrically connected to said surround right speaker; and a sound processor receiving as inputs said left channel audio signal and said right channel audio signal, said sound processor configured to generate a difference signal representing a difference between said surround left channel audio signal and said surround right channel audio signal, apply a spectral weighting to said difference signal thereby generating a spectrally weighted signal, and cross-cancel said spectrally weighted signal with said surround left channel audio signal and said surround right channel audio signal, thereby generating a first speaker signal and a second speaker signal for said pair of surround back speakers;

wherein said sound processor further comprises a phase equalizer for equalizing the phase of said difference signal prior to cross-cancellation, and a plurality of phase compensators complementary in phase characteristics to a combined phase characteristic of said phase equalizer and said spectral weighting filter, said phase compensators placed in series along each of said surround left channel audio signal and surround right channel audio signal, respectively, prior to cross-cancellation.

39. The sound reproduction system of claim 38, wherein said pair of surround back speakers comprises a surround left back speaker and a surround right back speaker.

40. The sound reproduction system of claim 38, wherein said pair of surround back speakers are located in a single speaker enclosure.

41. The sound reproduction system of claim 38, further comprising a left speaker, a right speaker, and a center speaker.

42. The sound reproduction system of claim 38, further comprising a first adaptive decorrelation circuit interposed between said surround left channel audio signal and said surround left speaker, and a second adaptive decorrelation circuit interposed between said surround right channel audio signal and said surround right speaker.

43. The sound reproduction system of claim 38, wherein said sound processor comprises a spectral weighting filter for applying said spectral weighting to said difference signal, said spectral weighting filter being characterized by a first filter region of relatively level gain, a second filter region having a generally decreasing gain with increasing frequency, and a third filter region of relatively level gain.

44. The sound reproduction system of claim 43, wherein said spectral weighting filter is further characterized by a roll-off from said first filter region to said second filter region at approximately 200 Hertz.

45. The sound reproduction system of claim 44, wherein said spectral weighting filter is further characterized by a boundary between said second filter region and said third filter region at approximately 2 KHz.

46. The sound reproduction system of claim 38, wherein said phase equalizer comprises a plurality of all pass filters, and wherein each of said phase compensators comprises a plurality of all pass filters.

47. The sound reproduction system of claim 38, wherein said sound processor comprises a linear filter for applying the spectral weighting to said difference signal.

48. The sound reproduction system of claim 38, wherein said surround left speaker and said surround right speaker are each dipole speakers.

* * * * *